Oct. 6, 1970 T. R. BUSHNELL 3,533,000
SELF-BIASING FREQUENCY DISCRIMINATOR CIRCUIT
Filed Oct. 27, 1967
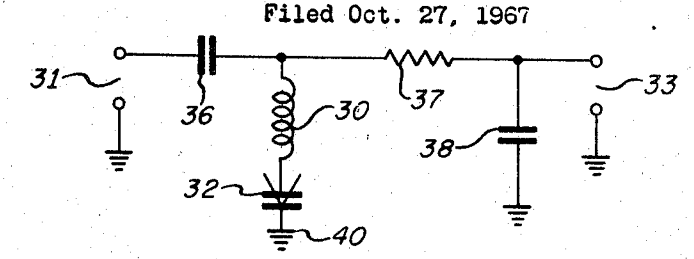
FIG. 1.
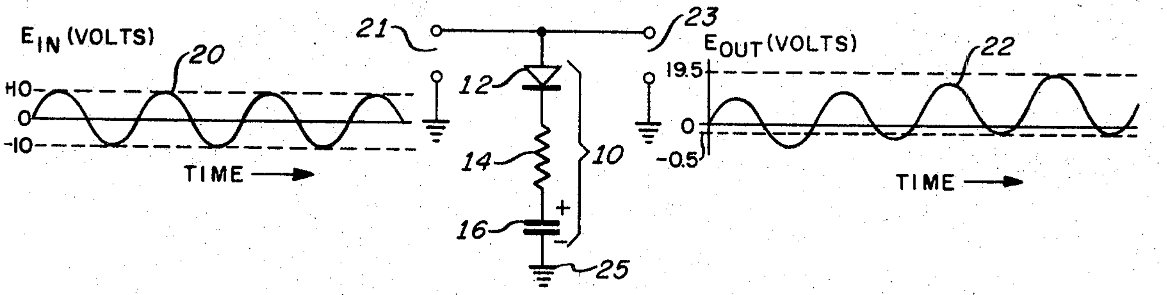
FIG. 2.
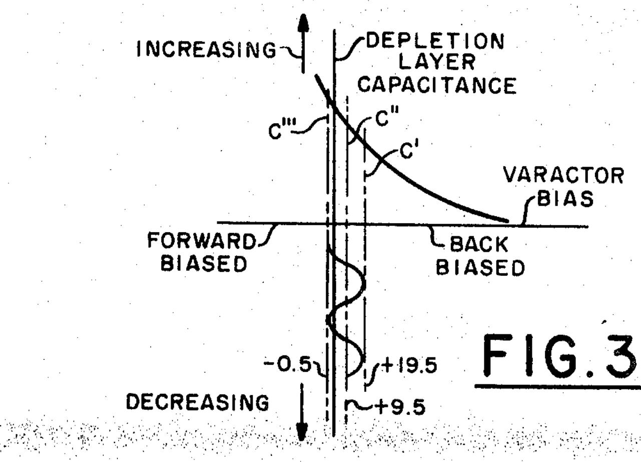
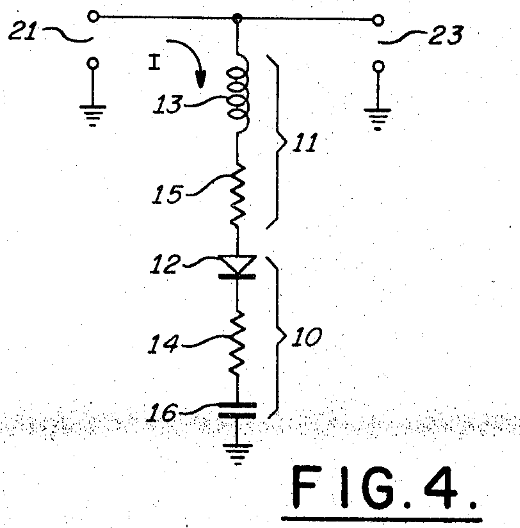
FIG. 3. FIG. 4.
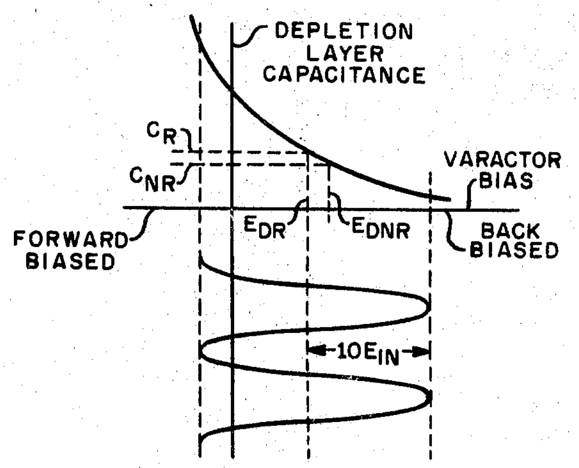
FIG. 5.
INVENTOR.
THOMAS R. BUSHNELL
BY S. C. Yeaton
ATTORNEY United States Patent Office 3,533,000

Patented Oct. 6, 1970

3,533,000
SELF-BIASING FREQUENCY DISCRIMINATOR CIRCUIT

Thomas R. Bushnell, Menlo Park, Calif., assignor to Sperry Rand Corporation, a corporation of Delaware Filed Oct. 27, 1967, Ser. No. 678,684
Int. Cl. H03c *3/20*; H03d *3/14*; H03j *3/18*
U.S. Cl. 329—119 3 Claims

ABSTRACT OF THE DISCLOSURE

A frequency discriminator comprising an inductor and a varactor diode connected to form a resonant circuit for providing, in response to an input signal applied thereto, a voltage having an amplitude proportional to the frequency of the input signal. The varactor diode rectifies the input signal and thereby establishes a self-bias across its inherent depletion layer capacitance. The bias causes the depletion layer capacitance to decrease until the circuit stabilizes above resonance. Thereafter, variations in the frequency of the input signal produces corresponding changes in the bias to provide a D.C. output signal indicative of the frequency variations.

BACKGROUND OF THE INVENTION

The present invention relates to frequency discriminators and more particularly to means for providing a simple, broadband microwave discriminator circuit which is stable over a wide temperature range.

Discriminator circuits designed for operation at frequencies below the microwave range generally comprise reactive tuning components and frequently include crystalline elements and ordinary semiconductor diodes having an inherently high degree of frequency stability. Varactor diodes are also often used in these circuits in conjunction with a D.C. voltage source which adjusts the bias across the diode to vary the response characteristics of the discriminator.

In the microwave frequency range (300 megacycles to 30,000 megacycles), crystal elements cannot be used because their upper frequency response is limited to about 150 megacycles. For this reason, frequency discrimination of microwave signals is generally accomplished by mixing the microwave signal with a low frequency stable reference signal to produce a difference frequency signal suitable for application to a conventional frequency discriminator. An alternative means for frequency discrimination of microwave signals utilizes high Q resonant cavity structures in combination with phase generating and mixing equipment. In apparatus of this type, a variable phase signal produced in response to a microwave signal is compared with a reference phase signal to produce a phase error signal indicative of the frequency deviation in the microwave signal. Both of these techniques have certain shortcomings. The frequency mixing apparatus, for instance, requires a stable reference source and signal mixing circuits. Moreover, if the microwave input signal has a very high frequency, several mixing operations may have to be performed to obtain a suitable difference frequency signal. In addition, this technique is limited to applications in which the center frequency of the discriminator is considerably greater than half the bandwidth of the microwave signal. A discriminator having a center frequency of 100 megacycles, for example, will not be able to accommodate the full bandwidth of a difference frequency signal obtained by mixing a stable reference signal with a microwave signal which as a 200 megacycle bandwidth. The microwave cavity technique, on the other hand, is not desirable because it requires a stable phase reference and phase comparator circuits. In addition, the cavity structures are large compared to reactive tuning elements.

SUMMARY OF THE INVENTION

The present invention relates to novel microwave frequency discriminator apparatus which overcomes the aforementioned disadvantages and limitations of prior art devices. In a preferred embodiment of the invention, an inductor is connected in series with a varactor diode to form a series resonant circuit. The diode conducts current in response to an input signal on alternate half cycles until the depletion layer capacitance of the varactor diode charges to a potential which reduces the capacitance enough to make the capacitive reactance greater than the inductive reactance so that the circuit stabilizes above resonance, the displacement of the stable point from resonance being determined by the magnitude of the input signal, the Q of the diode and the capacitance versus bias characteristic of the diode. Once the circuit has stabilized, an increase or decrease in the frequency of the microwave input signal causes the circuit to move respectively toward and away from resonance resulting in a corresponding increase or decrease of the varactor diode self-bias and thereby providing an indication of the magnitude and sense of the frequency deviation in the microwave input signal.

The depletion layer capacitance of the diode exhibits a stable operating characteristic over a range of temperatures extending from tens of degrees below to tens of degrees above 0° C. so that the circuit is stable over a wide temperature range. For a more detailed description of the invention, reference should be made to the following detailed disclosure and to the accompanying drawings wherein similar components are represented by the same numeral designations.

BRIEF DESCRIPTION OF THE DRAWINGS

FIG. 1 is a schematic of a preferred embodiment of the invention;

FIGS. 2 and 4 depict circuits useful for explaning the operation of the circuit shown in FIG. 1; and FIGS. 3 and 5 depict the depletion layer capacitance versus bias characteristic of the varactor diode used in the circuit of FIG. 1.

DESCRIPTION OF THE PREFERRED EMBODIMENT

Before proceeding to a description of the preferred embodiment of the invention depicted in FIG. 1, consider the circuits and graphs shown in FIGS. 2–5. Referring first to FIGS. 2 and 3, in FIG. 2 the series connected diode 12, resistor 14 ($R_D$) and capacitor 16 ($C_D$) constitute a combination 10 which may be regarded as the equivalent circuit of a varactor diode. Capacitor 16 represents the variable voltage controlled depletion layer capacitance associated with reverse bias less than the breakdown potential and very small values of forward-bias applied to the varactor diode. An A.C. signal 20 ($E_{in}$) applied to input terminals 21 causes current to flow through the diode, resistor and capacitor into ground terminal 25 during each positive half cycle of the input signal until the capacitor is charged, with polarity as indicated, to the peak value of the input signal minus the potential drop across the diode. The charging time is very short, lasting only a few cycles of the input signal, since the varactor diode is designed so that resistor 14 has very low resitance. Thereafter, the voltage 22 ($E_{out}$) appearing at the output terminals 23 alternates between −0.5 v. and +19.5 v. for corresponding alternations of the input signal between −10 v. and +10 v.

The voltage variable capacitor characteristic of the varactor diode is illustrated in FIG. 3 which depicts the variation of the depletion layer capacitance as a function of varactor bias. The 20 v. peak-to-peak signal ($E_{in}$) applied to input terminals 21 charges the depletion layer capacitance to 9.5 v. assuming that a 0.5 v. drop exists across diode 12 and that resistor 14 is negligible. As a result, diode 12 is forward-biased 0.5 v. when the input signal is +10 v. Likewise, when the input signal is at zero volts and −10 v., the diode is back-biased by 9.5 v. and 19.5 v. respectively. Thus, once the depletion layer capacitance 16 is fully charged to 9.5 v. a change in the output voltage 22 from −0.5 v. to +9.5 v. causes the back-bias across diode 12 to change from 19.5 v. to 9.5 v. respectively and then as the output voltage changes to +19.5 v. the diode becomes forward-biased 0.5 v. For these conditions of varactor bias, the depletion layer capacitance varies respectively from C′ to C″ to C‴, C″ being the average capacitance at a back-bias of 9.5 v. and (C‴–C′) being the range of capacitance variation produced by the alternating input signal.

Referring to FIG. 4, the diode 12, resistor 14 and capacitor 16 again constitute a combination 10 which represents the equivalent circuit of a varactor diode. Coil 13 (L) and resistor 15 ($R_L$), constitute a combination 11 representative of an inductor which is connected in series with the varactor diode to form a series resonant circuit. At the instant that an alternating current signal having a given amplitude and frequency is applied to input terminals 21, the depletion layer capacitance ($C_D$) of the varactor diode is at a relatively high value so that the capacitive reactance ($X_C$) of the varactor is less than the inductive reactance ($X_L$) of the coil. The rectification characteristic of the varactor diode, however, causes its bias to increase as explained with reference to FIG. 2, thereby decreasing the depletion layer capacitance and reducing the difference between the capacitive and inductive reactances so that the circuit moves toward resonance. Since the voltage across the inductive and capacitive components reaches a maximum at or close to resonance, the average back-bias across the varactor continues to increase to a value greater than the peak value of the input signal. This effect is regenerative because as the average reverse bias increases, the depletion layer capacitance decreases, thus moving the circuit closer to resonance which causes the reverse bias to increase even more and so on until the circuit reaches the point at which the voltage across the varactor is maximum.

For simplicity of discussion, it will be assumed that the point at which the varactor voltage is a maximum coincides with the resonant point. Actually though, in a series tuned circuit which is tuned to resonance by decreasing the capacitance, the voltage across the capacitors will be maximum slightly above resonance. This is so because the current flowing in the circuit reaches a maximum at resonance while the capacitive reactance ($X_C$) continues to increase above resonance. Therefore, it is not until some point above resonance that the decrease in current offsets the increase in capacitive reactance so that the voltage across the capacitance decreases along with the decreasing current. In a high Q circuit, however, where the current decreases rapidly as the circuit moves above resonance, the point at which the varactor voltage becomes maximum is almost the same as the resonant point, thus justifying the above assumption.

When the circuit reaches the resonant point where $X_L=X_C$, the R.F. drive voltage applied to the varactor provides an average D.C. bias which is larger than the bias required to operate there. The large bias causes the depletion layer capacitance to decrease even further whereupon $X_C$ becomes greater than $X_L$ and the circuit moves above resonance. This results in a reduction of the R.F. drive voltage across the varactor so that the circuit ultimately stabilizes at some point above resonance. The displacement of the stable point from resonance should be at least equal to and preferably greater than half the bandwidth of the tuned circuit. Having reached the stable point, if the reverse bias tends to increase further, the depletion layer capacitance will decrease and $X_C$ will increase thus making the difference between $X_C$ and $X_L$ even larger. Consequently, the circuit will tend to move further from resonance causing the R.F. drive voltage across the varactor to decrease, which in turn causes the average D.C. reverse bias to decrease and thereby cancel its initial tendency to increase. Likewise, if the reverse bias tends to decrease, after reaching the stable point, the depletion layer capacitance will increase and $X_C$ will decrease thereby reducing the difference between $X_C$ and $X_L$ and causing the circuit to tend to move toward resonance so that the R.F. drive voltage across the varactor increases, which in turn increases the average D.C. reverse bias and thus cancels its initial tendency to decrease.

It is therefore seen that when a varactor diode is connected in a tuned circuit and permitted to determine its own bias, it will tune the circuit to a point above resonance irrespective of what the frequency of the input signal happens to be. This presupposes, of course, that the input signal is of sufficient magnitude to effect the required change of the depletion layer capacitance and further that the required capacitance is within the range of the particular varactor diode being used.

The separation between the resonant and stable operating points is determined by the magnitude of the input signal, the Q of the varactor diode and the depletion layer capacitance versus bias characteristic of the varactor. The input signal must, of course, be of sufficient magnitude to drive the circuit to the stable point. These statements and the foregoing qualitative description of the manner in which the circuit automatically tunes to a point above resonance may be clarified somewhat by the following quantitative discussion. Assume that when the input signal $E_{in}$ of a given amplitude and frequency is first applied to the circuit of FIG. 4 the depletion layer capacitance ($C_D$) has a value such that the capacitive reactance ($X_C$) is one-half the value of the inductive reactance ($X_L$) of coil 13.

Then, $$X_C=\frac{1}{2\pi fC}=\frac{1}{2}X_L=\frac{2\pi fL}{2}$$

The current (I) flowing in the circuit is therefore:

$$I=\frac{E_{in}}{[(R_D+R_L)^2+(X_L-X_C)^2]^{1/2}}$$

and the R.F. drive voltage ($E_D$) across the varactor is $$E_D=X_C(I)$$

or substituting $X_L=2X_C$ $$E_D=\frac{X_CE_{in}}{[(R_D+R_L)^2+X_C^2]^{1/2}}$$

If both the inductor and the varactor have a large Q, then $X_C$ and $X_L$ are respectively much larger than $R_D$ and $R_L$ so that $$E_D=E_{in}$$

Now consider the situation at resonance where $X_L=X_C$. In this case the current flowing in the circuit is $$I=\frac{E_{in}}{R_D+R_L}$$

and the R.F. drive voltage across the varactor is $$E_D=\frac{X_CE_{in}}{R_D+R_L}$$

Then, if the Q of the inductor ($Q_L=X_L/R_L$) is 200 and the Q of the varactor ($Q_D=X_C/R_D$) is 10, $R_D$ will be 20 times greater than $R_L$. This results since $X_L=X_C$ and therefore $200R_L=X_L=X_C=10R_D$ or $R_D=20R_L$.

Consequently, the influence of $R_L$ in determining the current may be disregarded, so substituting $$R_D = X_C/10$$
$$E_D \neq 10E_{in}$$

Hence, it is seen that the R.F. drive voltage across the varactor at resonance is ten times the magnitude of the input R.F. signal. This condition is illustrated in FIG. 5 with the average bias and resulting depletion layer capacitance being $E_{DR}$ and $C_R$, respectively. As hereinbefore explained, the circuit is not stable at resonance because the bias produced at that point is excessively high causing the circuit to be driven above resonance thereby diminishing the back-bias and forward-bias peaks, such that the forward-bias is limited to about 0.5 V., and causing the average bias and associated depletion layer capacitance to change to the values $E_{DNR}$ and $C_{NR}$, respectively.

Having determined the means by which the circuit of FIG. 4 stabilizes above resonance, refer now to FIG. 1, which is identical to FIG. 4 except that equivalent circuit representations are not used and additional components are included for reasons that will be discussed subsequently. A microwave signal of a given amplitude and frequency applied to input terminals 31 passes through blocking capacitor 36 to the inductor 30 and varactor 32 into ground 40, the inductor and varactor forming a series resonant circuit and the input signal establishing a self-bias across the varactor as explained with reference to FIG. 4 to provide stable operation at a particular point above resonance. The only requirement for the blocking capacitor is that its capacitance must be sufficiently large that it does not attenuate the input signal or affect the operation of the series resonant circuit. Now, if the frequency of the input signal increases, the reactance ($X_C$) of the varactor's depletion layer capacitance will decrease while the inductive reactance ($X_L$) increases thereby reducing the difference between $X_C$ and $X_L$ so that the operating point moves toward resonance and causes the average self-bias to increase. In a similar manner, if the input frequency decreases, $X_C$ will increase and $X_L$ will decrease causing the difference between them to increase so that the operating point moves away from resonance resulting in a decrease in the reverse bias. The variations in the average self-bias therefore provide, at output terminals 33, a signal indicative of the frequency deviation of the input signal from its nominal value. Resistor 37 and capacitor 38 comprise a long time constant filter network which removes the A.C. component of the self-bias from the output signal. Resistor 37 should be large enough so as not to affect the R.F. drive voltage across the varactor.

It should be noted that the varactor discriminator is fairly insensitive to variations in the amplitude of the input signal once the circuit has reached its stable point. Thereafter, if the amplitude of the input signal increases, the bias will increase until the depletion layer capacitance decreases enough to detune the circuit and reduce the bias to its original value. Similar operation occurs if the input signal amplitude decreases. Sensitivity to amplitude changes, however, is inversely proportional to the Q of the circuit because if the Q is high, the bias will change by a greater amount with less detuning than would be obtained for the same amount of detuning in a low Q circuit. In any event, if the amplitude variations become too large, it will be necessary to use a limiter at the input of the varactor discriminator. It should also be noted that the varactor discriminator, unlike prior art microwave discriminator apparatus, does not require a power source separate from the input signal and therefore is not affected by power supply variations. Moreover, while the circuit is considered to be particularly useful at microwave frequencies, it is also adaptable for use outside that range.

Although a series resonant circuit has been described as the preferred embodiment, a parallel resonant configuration, wherein the varactor is connected across the inductor, will operate in essentially the same manner as should be obvious from the equivalence that may be established between series and parallel circuits.

What is claimed is:

1. A frequency discriminator comprising
an inductor,
a diode connected to the inductor to form a circuit capable of operating in a resonant mode,
said diode having depletion layer capacitance properties when reverse biased to a level less than its breakdown potential, said reverse bias being established across said depletion layer capacitance solely in response to an A.C. signal applied to said circuit and the gradient of said depletion layer capacitance as a function of said reverse bias being such that said circuit stabilizes at a point above resonance in response of said A.C. signal, input means connected to said circuit for applying said A.C. signal thereto, and
output means connected to said circuit for providing an output signal having an amplitude proportional to the frequency of said A.C. signal.

2. The apparatus of claim 1 wherein the diode is connected in series with the inductor and the output means is connected across the series combination.

3. The apparatus of claim 2 including a capacitor connected in series between said input means and the series combination of the inductor and diode, said capacitor having a value substantially larger than the depletion layer capacitance of the diode at the stable operating point and functioning to block any D.C. components at the input from said diode to preclude variations of said reverse bias thereby.

References Cited

UNITED STATES PATENTS

| | | | |
|---|---|---|---|
| 2,915,631 | 12/1959 | Nilssen. | |
| 3,029,339 | 4/1962 | Pan. | |
| 3,204,190 | 8/1965 | Broadhead | 329—119 |
| 3,332,035 | 7/1967 | Kovalevski. | |
| 3,287,621 | 11/1966 | Weaver | 325—449 X |

ALFRED L. BRODY, Primary Examiner

U.S. Cl. X.R.

307—233, 320; 325—441; 329—140, 205; 331—36, 177; 332—30; 333—15